United States Patent
Liu et al.

(10) Patent No.: US 9,331,075 B2
(45) Date of Patent: May 3, 2016

(54) SYSTEMS AND METHODS FOR FABRICATING SEMICONDUCTOR DEVICES AT DIFFERENT LEVELS

(71) Applicant: Taiwan Semiconductor Manufacturing Company Limited, Hsinchu (TW)

(72) Inventors: Chi-Wen Liu, Hsinchu (TW); Chao-Hsiung Wang, Hsin-Chu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/926,117

(22) Filed: Oct. 29, 2015

(65) Prior Publication Data

US 2016/0049396 A1   Feb. 18, 2016

Related U.S. Application Data

(62) Division of application No. 13/956,437, filed on Aug. 1, 2013, now Pat. No. 9,178,065.

(51) Int. Cl.
| | |
|---|---|
| *H01L 27/088* | (2006.01) |
| *H01L 29/78* | (2006.01) |
| *H01L 27/06* | (2006.01) |
| *H01L 29/06* | (2006.01) |

(52) U.S. Cl.
CPC ........ *H01L 27/0886* (2013.01); *H01L 27/0623* (2013.01); *H01L 27/0629* (2013.01); *H01L 29/0649* (2013.01); *H01L 29/78* (2013.01); *H01L 29/7851* (2013.01)

(58) Field of Classification Search
CPC .......................... H01L 29/785; H01L 29/1033
USPC ................................................. 257/368–410
See application file for complete search history.

(56) References Cited

U.S. PATENT DOCUMENTS

| | | | |
|---|---|---|---|
| 7,800,197 B2 | 9/2010 | Hwang et al. | |
| 8,580,624 B2* | 11/2013 | Bangsaruntip | .... H01L 29/66469 257/351 |
| 2011/0175152 A1* | 7/2011 | Booth, Jr. | ............ H01L 27/1211 257/306 |
| 2012/0056263 A1 | 3/2012 | Lee et al. | |
| 2012/0248400 A1 | 10/2012 | Yu et al. | |

\* cited by examiner

*Primary Examiner* — Cuong Q Nguyen
(74) *Attorney, Agent, or Firm* — Jones Day

(57) ABSTRACT

Systems and methods are provided for fabricating semiconductor device structures on a substrate. For example, a substrate including a first region and a second region is provided. One or more first semiconductor device structures are formed on the first region. One or more semiconductor fins are formed on the second region. One or more second semiconductor device structures are formed on the semiconductor fins. A top surface of the semiconductor fins is higher than a top surface of the first semiconductor device structures.

20 Claims, 6 Drawing Sheets

SYSTEMS AND METHODS FOR FABRICATING SEMICONDUCTOR DEVICES AT DIFFERENT LEVELS

CROSS-REFERENCE TO RELATED APPLICATIONS

This application is a divisional application of U.S. patent application Ser. No. 13/956,437, entitled "Systems and Methods for Fabricating Semiconductor Devices at Different Levels," filed Aug. 1, 2013, which is incorporated herein by reference in its entirety.

FIELD

The technology described in this disclosure relates generally to semiconductor devices and more particularly to fabrication of semiconductor devices.

BACKGROUND

An integrated circuit (IC) chip often includes core devices for performing certain functions and input/output (I/O) devices for communicating with external circuits. For example, a metal-oxide-semiconductor (MOS) transistor may be implemented as either a core device, or an I/O device.

Transistors used for core devices and I/O devices are often different. For example, an I/O device usually has a relatively thick gate oxide in order to sustain a high voltage applied to the peripheral circuit. On the other hand, a core device often requires a very thin gate oxide to achieve a strong capacitive effect for good current control. However, on an IC chip, core devices and I/O devices are usually fabricated at approximately the same level relative to the substrate, which sometimes makes it challenging to make the core devices and the I/O devices according to their respective best specifications. For example, the core devices often suffer leakage currents to the substrate.

DETAILED DESCRIPTION

Figure 1:
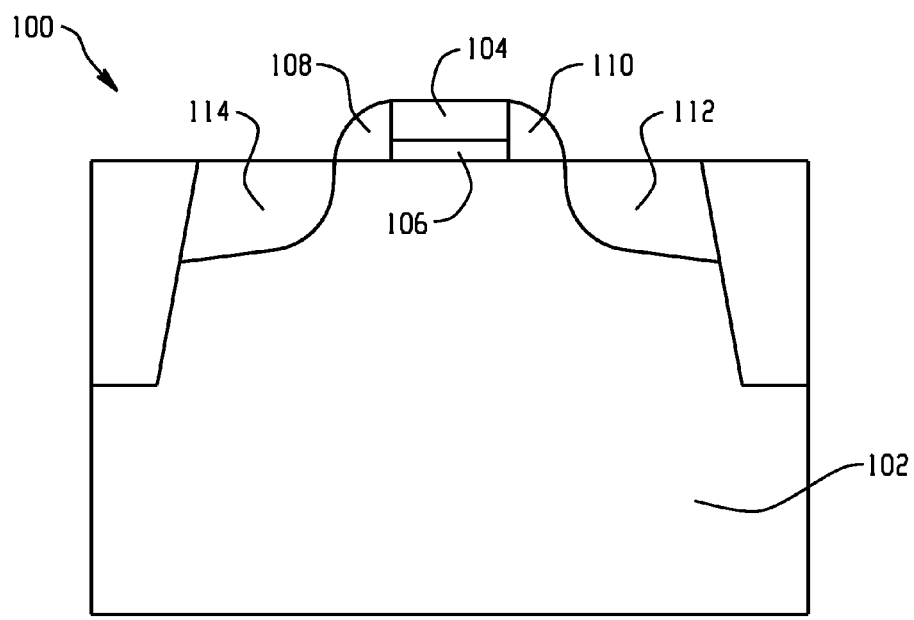
FIG. 1 depicts an example diagram showing a cross-section view of a transistor structure.

As shown in FIG. 1, a MOS transistor 100 is formed on a substrate 102 (e.g., a silicon substrate). A gate structure of the MOS transistor 100 includes a gate electrode 104 and a gate oxide 106. The gate electrode 104 may be made of a metal or a crystalline polysilicon, and the gate oxide 106 may be generated by oxidizing a portion of the substrate 102. Spacers 108 and 110 are placed on both sides of the gate electrode 104, respectively. A source region 112 and a drain region 114 are formed in the substrate 102, usually by ion implantation. In operation, a current may flow under the gate structure in response to a certain voltage applied to the gate electrode 104.

Figure 2:
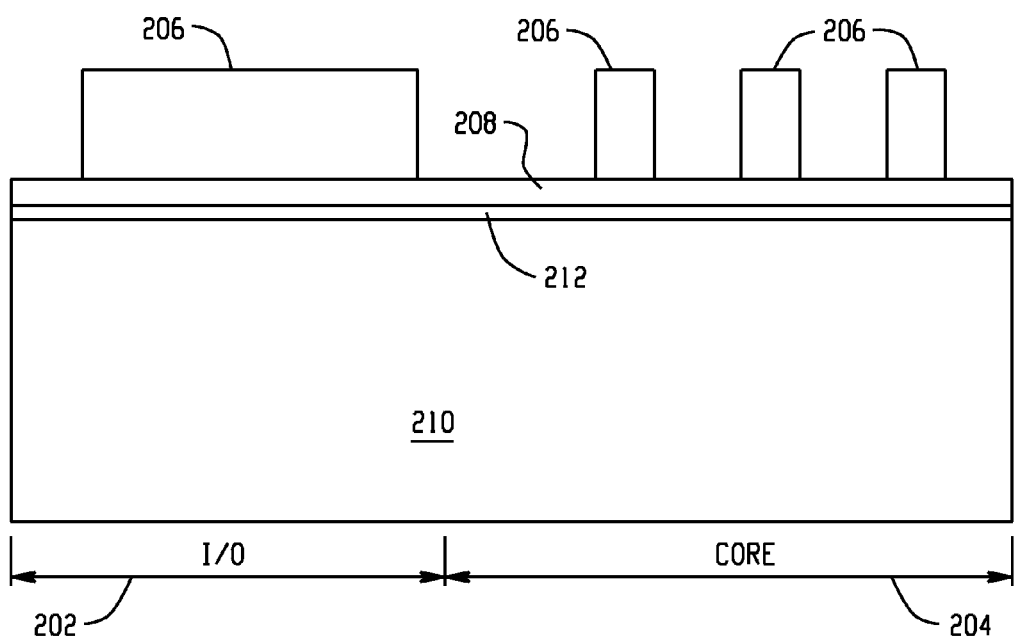
FIGS. 2-10 depict example diagrams of an example process flow for fabricating core device structures and I/O device structures at different levels.

FIGS. 2-10 depict example diagrams of an example process flow for fabricating core device structures and I/O device structures at different levels. As shown in FIG. 2, a photolithography process may be used to define an I/O region 202 and a core region 204 for fabricating I/O device structures and core device structures respectively. A photo-sensitive layer 206 (e.g., photoresist) may be initially formed on top of a hard mark layer 208 (e.g., $Si_3N_4$) which is separated from a substrate 210 by a buffer layer 212 (e.g., $SiO_2$). For example, the substrate 210 may include silicon, germanium, silicon germanium, III-V materials (e.g., gallium arsenide, silicon carbide, indium arsenide, or indium phosphide), or a combination thereof. Further, the substrate 210 may include an epitaxial layer (epi-layer), may be strained for performance enhancement, and/or may include a silicon-on-insulator (SOI) structure. The photo-sensitive layer 206 may then be selectively exposed to light through a mask, and the exposed portion may possess different physical properties than the unexposed portion. Either the exposed portion or the unexposed portion of the photo-sensitive layer 206 may be removed by a selected solvent. As shown in FIG. 2, the portion of the photo-sensitive layer 206 that is not removed may be used to protect the structures below.

Figure 3:
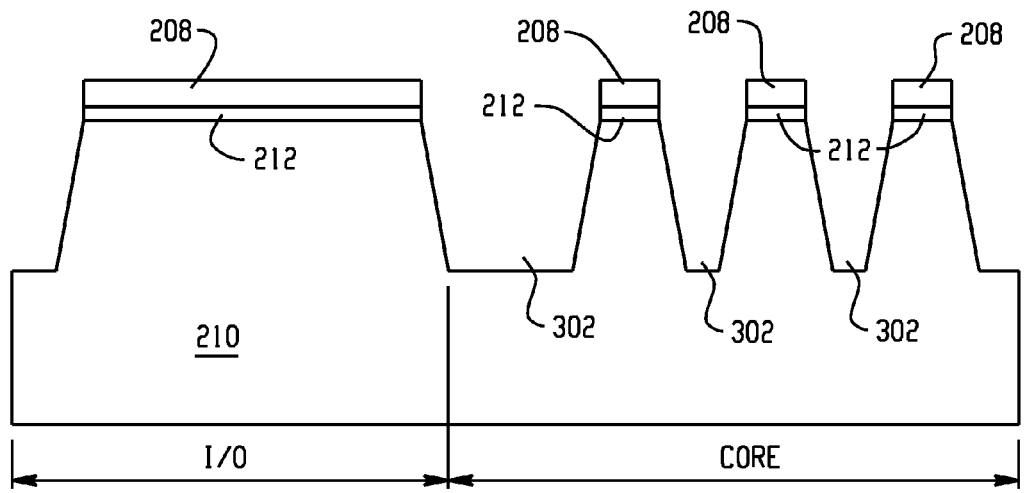

Recessed regions 302 may be formed as a result of etching the substrate 210, as shown in FIG. 3. For example, the substrate may undergo a wet etching process, where the substrate may be immersed in a bath of a selected etchant and parts of the substrate may be removed. Or, a dry etching process, such as plasma etching, may be used to etch the substrate, where energetic free radicals produced by the plasma may react at the surface of the substrate to remove parts of the substrate.

Figure 4:
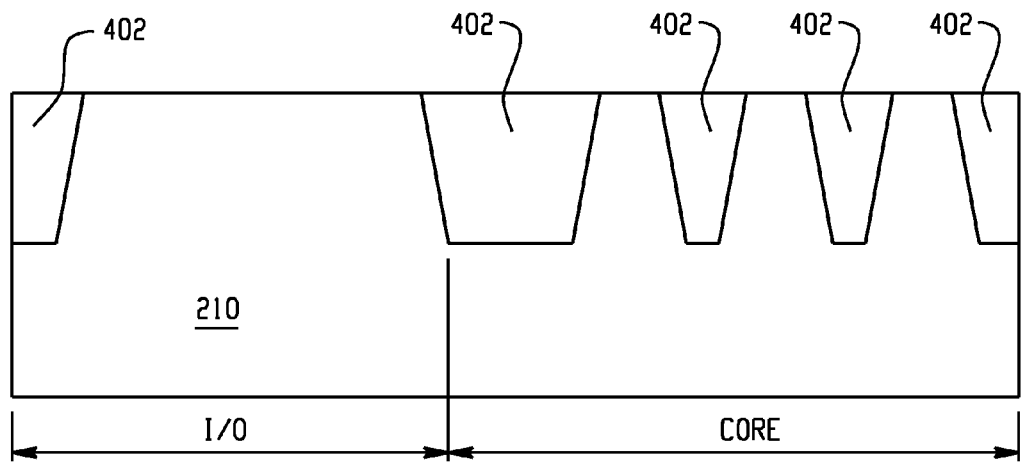

A dielectric layer 402 (e.g., $SiO_2$) may be formed to fill the recessed regions 302, and a chemical-mechanical polishing/planarization (CMP) process may be applied to the dielectric layer 402, the hard mask layer 208 and the buffer layer 212 to form a structure as shown in FIG. 4. The hard mask layer 208 and the buffer layer 212 may be removed after the CMP process. For example, the dielectric layer 402 may be formed through physical vapor deposition (PVD), chemical vapor deposition (CVD), or atomic layer deposition (ALD). As an example, the CMP process may use an abrasive and corrosive chemical slurry (e.g., a colloid) in conjunction with a polishing pad and a retaining ring to make the top surface substantially flat or planar (as shown in FIG. 4).

Figure 5:
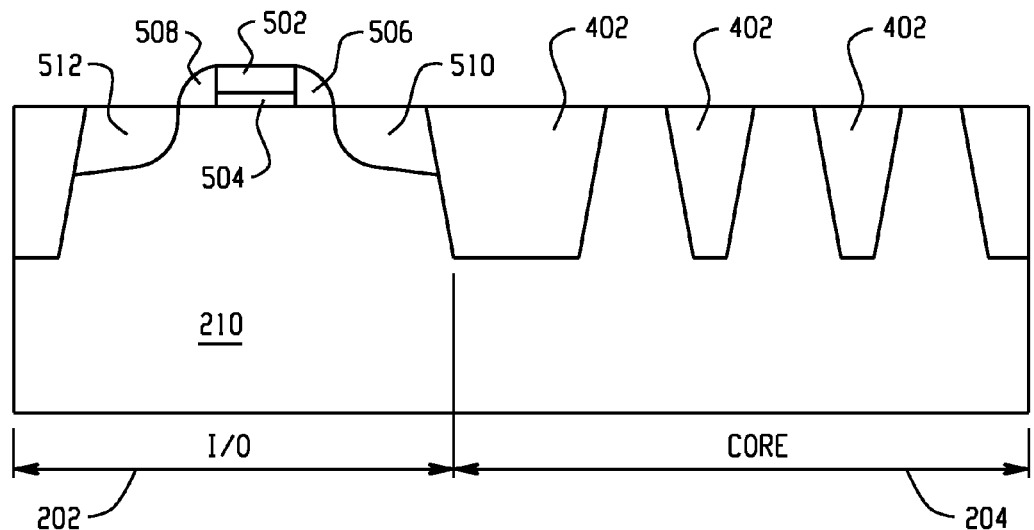

Then, one or more I/O device structures may be formed on the I/O region 202, as shown in FIG. 5. A gate structure of an I/O device structure includes a gate electrode 502 (e.g., Al, TiAl, W, TiN, TaN) and a gate dielectric 504 (e.g., $SiO_2$, high-k materials). For example, the gate dielectric 504 may be grown on the substrate 210 through oxidation or deposition (e.g., PVD, CVD, ALD). The I/O device structure further includes spacers 506 and 508 (e.g., $SiO_2$, $Si_3N_4$), and source/drain regions 510 and 512 (e.g., formed by ion implantation).

Figure 6:
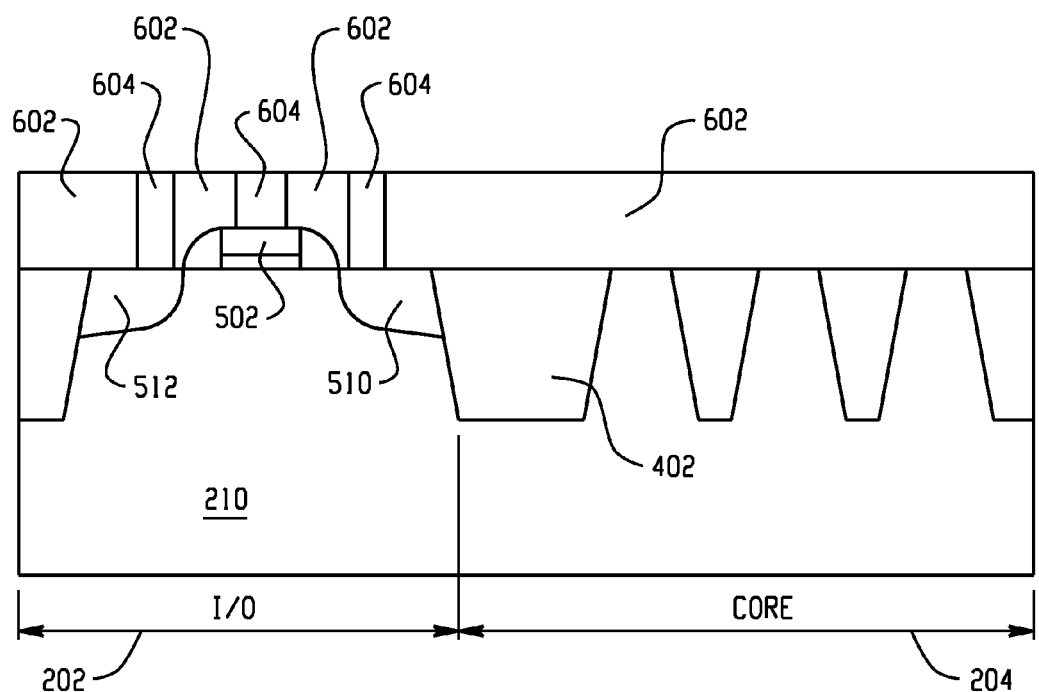

As shown in FIG. 6, a first inter-layer dielectric (ILD) layer 602 (e.g., $SiO_2$, PSG) may be formed on the I/O region 202 and the core region 204. Contact holes are made within the first inter-layer dielectric (ILD) layer 602, and a contact layer 604 (e.g., Al, Cu, W, TiN, TaN) is formed in the contact holes to provide contact to the gate electrode 502 and the source/drain regions 510 and 512. For example, the first ILD layer 602 may be used to electrically separate closely spaced interconnect lines arranged in several levels in a later metallization process. In another example, the contact holes and/or the contact layer 604 may not be made until other components of the I/O device structures and the core device structures have been formed.

Figure 7:
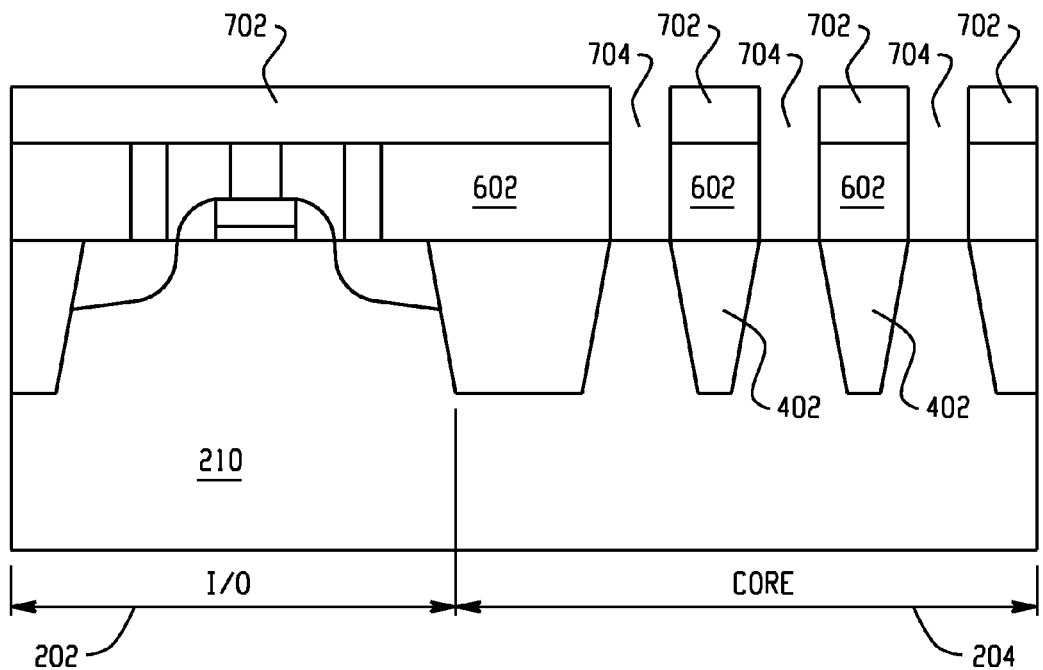
Figure 8:
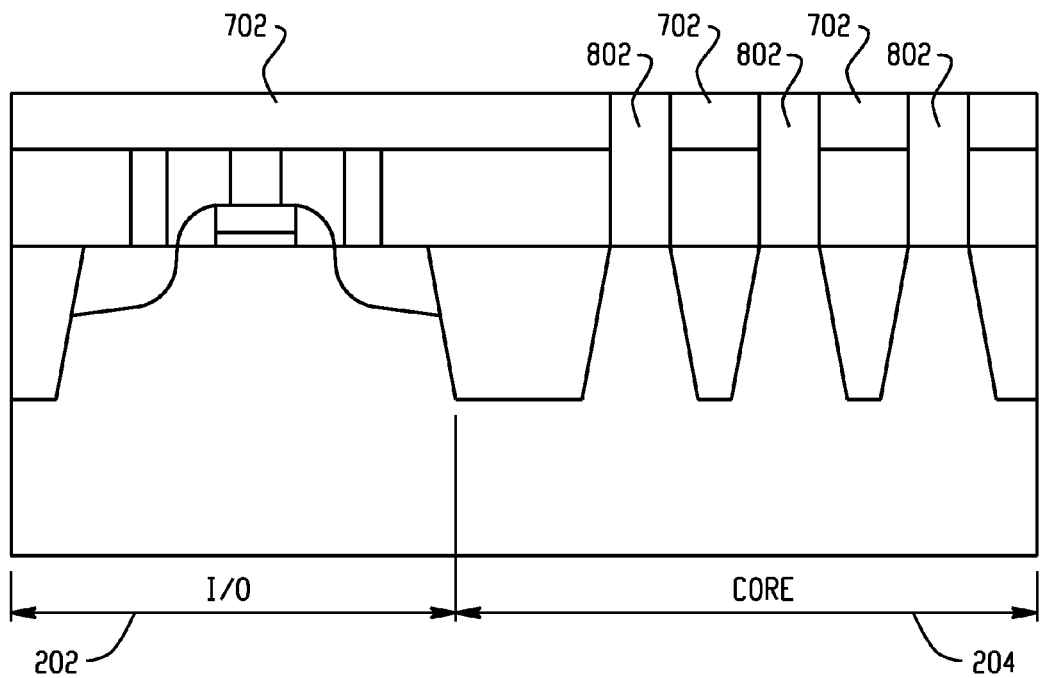

Then, a second ILD layer 702 (e.g., $SiO_2$, PSG) may be formed on the I/O region 202 and the core region 204, and openings 704 are made on the core region 204 through the first ILD layer 602 and the second ILD layer 702, as shown in FIG. 7. Then, a semiconductor layer 802 is grown (e.g., epitaxially) in the openings 704 until the openings 704 are filled up, and a CMP process may be performed to form a structure as shown in FIG. 8. For example, the semiconductor layer 802 may include silicon, germanium, silicon germanium, III-V materials, or a combination thereof. In another example, the semiconductor layer 802 may include the same material as the substrate 210.

Figure 9:
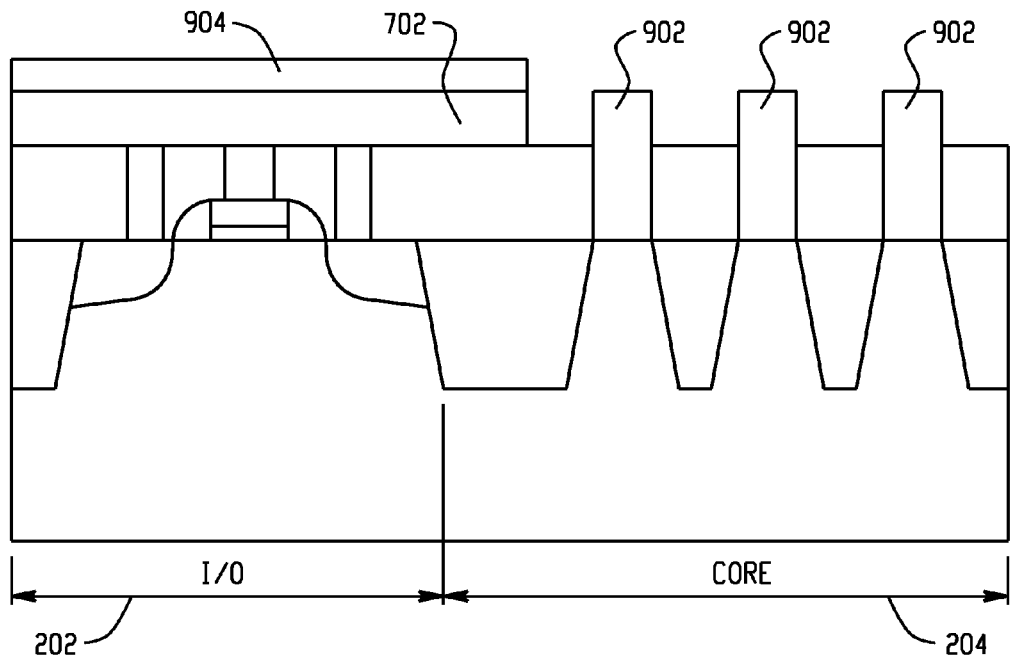
Figure 10:
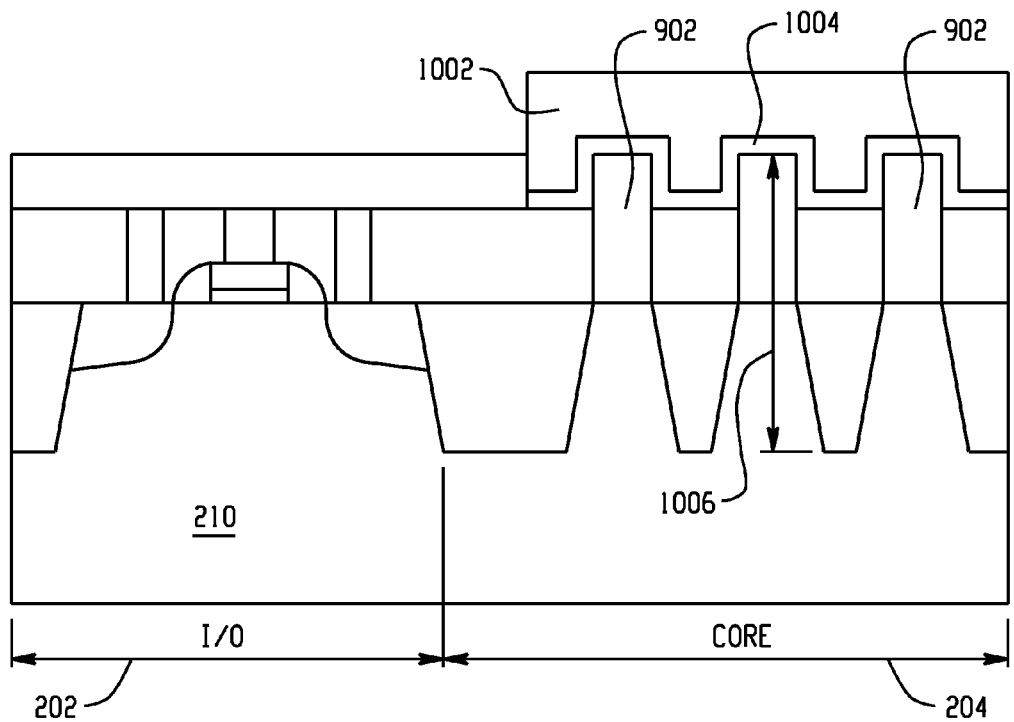

Part of the second ILD layer 702 on the core region 204 may be removed (e.g., through wet etching or dry etching) after a photolithography process during which a photo-sensitive layer 904 (e.g., photoresist) may be formed on top of the second ILD layer 702 and removed partly after being selectively exposed to light, as shown in FIG. 9. One or more semiconductor fins 902 may be exposed on the core region 204, wherein a top surface of the semiconductor fins 902 is higher than a top surface of the I/O device structures. Then, one or more core device structures may be formed on the semiconductor fins 902, as shown in FIG. 10. A gate structure of the core device structures includes a gate electrode 1002 (e.g., Al, TiAl, W, TiN, TaN) and a gate dielectric 1004 (e.g., $SiO_2$, a high-k material).

The height of the semiconductor fins 902 may be properly chosen during fabrication to increase the current path for leakage currents from the core devices to the substrate 210 so as to reduce such leakage currents. In some embodiments, the height of the semiconductor fins 902 may be determined based on a critical thickness associated with the material of the semiconductor fins 902. For example, if the substrate 210 is a silicon substrate and the semiconductor fins 902 are made of silicon germanium, the lattice mismatch between the substrate 210 and the semiconductor fins 902 may cause some defects in the semiconductor fins 902 and such defects may affect the quality of devices built on the semiconductor fins 902 when the height of the semiconductor fins 902 is not much larger than the critical thickness (e.g., about 50 nm). In one embodiment, the semiconductor fins 902 may have a height at least several times larger than the critical thickness. For example, the height of the semiconductor fins 902 may be no smaller than about 150 nm. In some embodiments, the height of the semiconductor fins 902 may be equal to a sum of the height of the first ILD layer 602 and the height of the second ILD layer 702. For example, the height of the first ILD layer 602 may be determined based on at least information associated with the critical thickness, and the height of the second ILD layer 702 may be determined based on at least information associated with the width of the semiconductor fins 902.

Figure 11:
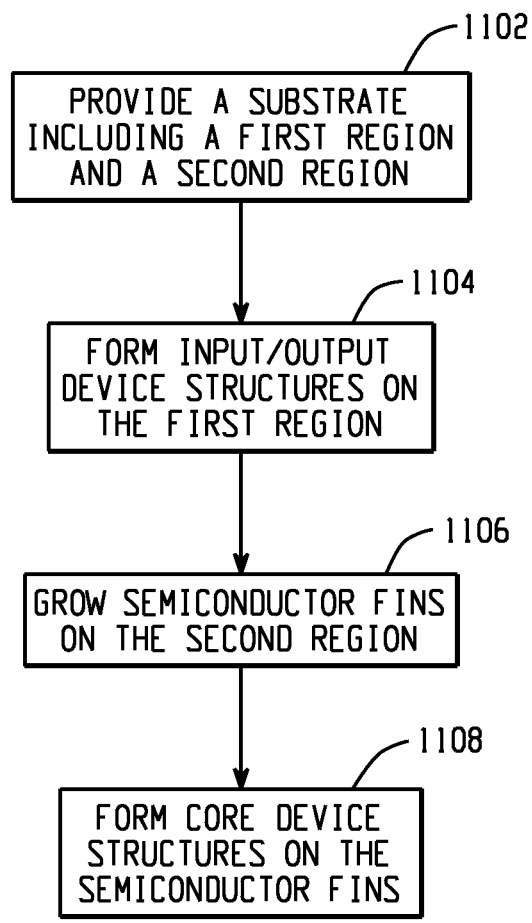
FIG. 11 depicts an example flow chart for fabricating core device structures and I/O device structures on a substrate.

FIG. 11 depicts an example flow chart for fabricating input/output device structures and core device structures on a substrate. At 1102, a substrate including a first region and a second region is provided. At 1104, one or more input/output device structures are formed on the first region. At 1106, one or more semiconductor fins are grown on the second region. At 1108, one or more core device structures are formed on the semiconductor fins.

This written description uses examples to disclose the invention, include the best mode, and also to enable a person skilled in the art to make and use the invention. The patentable scope of the invention may include other examples that occur to those skilled in the art. One skilled in the relevant art will recognize that the various embodiments may be practiced without one or more of the specific details, or with other replacement and/or additional methods, materials, or components. For example, I/O device structures and core device structures are described herein merely as examples, and the concepts, structures, layouts, materials, or operations may also be applicable to any other types of semiconductor devices, such as bipolar junction transistors, diodes, capacitors, etc. In some embodiments, the I/O device structures as shown in FIGS. 2-10 may be replaced with diode structures, bipolar junction transistor structures, or other semiconductor device structures. For example, the core device structures may not sustain a high processing temperature under which the diodes, bipolar junction transistors or other junction-based semiconductor devices are usually fabricated, and thus the core device structures may be fabricated after the junction-based semiconductor devices have been made. As an example, the implementation of semiconductor fins (e.g., the fins 902) may reduce intrinsic capacitance of semiconductor devices fabricated on the semiconductor fins. In certain embodiments, the core device structures as shown in FIGS. 2-10 may be replaced with other semiconductor device structures.

In accordance with the teachings described herein, systems and methods are provided for fabricating semiconductor device structures on a substrate. For example, a substrate including a first region and a second region is provided. One or more first semiconductor device structures are formed on the first region. One or more semiconductor fins are formed on the second region. One or more second semiconductor device structures are formed on the semiconductor fins. A top surface of the semiconductor fins is higher than a top surface of the first semiconductor device structures.

In one embodiment, an article includes a substrate, one or more first semiconductor device structures, and one or more second semiconductor device structures. The substrate includes a first region and a second region. The first semiconductor device structures are formed on the first region. The second semiconductor device structures are formed on one or more semiconductor fins on the second region. A top surface of the semiconductor fins is higher than a top surface of the first semiconductor device structures.

Well-known structures, materials, or operations may not be shown or described in detail to avoid obscuring aspects of various embodiments described in this disclosure. Various embodiments shown in the figures are illustrative example representations and are not necessarily drawn to scale. Particular features, structures, materials, or characteristics may be combined in any suitable manner in one or more embodiments. Various additional layers and/or structures may be included and/or described features may be omitted in other embodiments. Various operations may be described as multiple discrete operations in turn, in a manner that is most helpful in understanding this disclosure. However, the order of description should not be construed as to imply that these operations are necessarily order dependent. In particular, these operations need not be performed in the order of presentation. Operations described herein may be performed in a different order, in series or in parallel, than the described embodiment. Various additional operations may be performed and/or described. Operations may be omitted in additional embodiments.

This written description and the following claims may include terms, such as left, right, top, bottom, over, under, upper, lower, first, second, etc. that are used for descriptive purposes only and are not to be construed as limiting. For example, terms designating relative vertical position may refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and may still fall within the meaning of the term "top." The term "on" as used herein (including in the claims) may not indicate that a first layer "on" a second layer is directly on and in immediate contact with the second layer unless such is specifically stated; there may be a third layer or other structure between the first layer and the second layer on the first layer. As an example, the structures, layouts, materials, operations, voltage levels, or current levels related to "source" and "drain" described herein (including in the claims) may be interchangeable as a result of transistors with "source" and "drain" being symmetrical devices. The term "substrate" may refer to any construction comprising one or more semiconductive materials, including, but not limited to, bulk semiconductive materials such as a semiconductive wafer (either alone or in assemblies comprising other materials thereon), and semiconductive material layers (either alone or in assemblies comprising other materials). The embodiments of a device or article described herein can be manufactured, used, or shipped in a number of positions and orientations. Persons skilled in the art will recognize various equivalent combinations and substitutions for various components shown in the figures.

What is claimed is:

1. A semiconductor structure, comprising:
a substrate including a first region and a second region;
a first semiconductor device structure formed on the first region;
a semiconductor fin grown in the second region; and
a second semiconductor device structure formed on the semiconductor fin, wherein a top surface of the semiconductor fin is higher than a top surface of the first semiconductor device structure.

2. The structure of claim 1, wherein the second semiconductor device structure includes a core device structure.

3. The structure of claim 1, wherein the first semiconductor device structure selectively includes an input/output device structure, a diode structure, and a bipolar junction device structure.

4. The structure of claim 1, the second region further including a third region formed by filling a plurality of recessed regions in the second region with a dielectric material, the recessed region being formed by removing part of the substrate in the second region.

5. The structure of claim 4, wherein the semiconductor fin is formed between a pair of the adjacent recessed regions.

6. The structure of claim 1, wherein the first semiconductor device structure includes a source region, a drain region, a spacer, and a first gate structure, and wherein the second semiconductor device structure includes a second gate structure.

7. The structure of claim 6, wherein a top surface of the second gate structure is higher than a top surface of the first gate structure.

8. The structure of claim 7, wherein the first gate structure includes a first gate electrode and a first gate dielectric, and the second gate structure includes a second gate electrode and a second gate dielectric.

9. The structure of claim 1, wherein the semiconductor fin is epitaxially grown in the second region.

10. A semiconductor structure, comprising:
a substrate having a laterally adjacent first and second device regions defined thereon;
a first device formed on the substrate in the first device region;
a fin structure disposed on the substrate in the second device region; and
a second device formed from the fin structure in the second device region,
wherein a height of the fin structure is higher than that of the first device.

11. The structure of claim 10, further comprising a plurality of isolation structures filled in a plurality of recessed regions in the second device region, wherein a fin root structure is defined between an adjacent pair of the isolation structures.

12. The structure of claim 11, wherein the fin structure is disposed in the second device region on the fin root structure, wherein the fin structure and the fin root structure in the second device region cooperatively establish an increased current path for the second device.

13. The structure of claim 10, further comprising a first dielectric layer covering the first device in the first device region.

14. The structure of claim 13, wherein the coverage of the first dielectric layer extends into the second device region, wherein a top portion of the fin structure protrudingly exposes from the first dielectric layer.

15. The structure of claim 14, further including a second dielectric layer disposed on the first dielectric layer in the first device region.

16. The structure of claim 14, wherein the height of the fin structure in the second device region is substantially equal to a combined thickness of the first and the second dielectric layers.

17. The structure of claim 16, wherein the fin structure has a height of no less than about 150 nm.

18. The structure of claim 10, wherein the first device further comprises a first gate structure that includes a first gate dielectric layer, wherein the second device further comprises a second gate structure that includes a second gate dielectric layer, wherein a thickness of the first gate dielectric layer is substantially greater than that of the second gate dielectric layer.

19. The structure of claim 10, wherein the first device is an I/O device, and wherein the second device is a core device.

20. A semiconductor structure, comprising:
a substrate having a laterally adjacent first and second device regions defined thereon;
a first device formed on the substrate in the first device region;
a pair of isolation structures spacedly formed in the substrate in the second device region and defining a fin root structure there-between,
a fin structure disposed on the fin root structure in the second device region between the isolation structures; and
a second device formed from the fin structure in the second device region,
wherein a height of the fin structure is higher than that of the first device, and
wherein the fin structure and the fin root structure in the second device region cooperatively establish an increased current path for the second device.

* * * * *